United States Patent
Gillingham (10) Patent No.: US 6,708,250 B2
(45) Date of Patent: Mar. 16, 2004

(54) CIRCUIT AND METHOD FOR PERFORMING VARIABLE WIDTH SEARCHES IN A CONTENT ADDRESSABLE MEMORY

(75) Inventor: Peter Gillingham, Kanata (CA)

(73) Assignee: Mosaid Technologies Incorporated, Kanata (CA)

( * ) Notice: Subject to any disclaimer, the term of this patent is extended or adjusted under 35 U.S.C. 154(b) by 50 days.

(21) Appl. No.: 09/997,296

(22) Filed: Nov. 30, 2001

(65) Prior Publication Data

US 2003/0070039 A1 Apr. 10, 2003

Related U.S. Application Data (60) Provisional application No. 60/325,217, filed on Sep. 28, 2001.

(51) Int. Cl.[7] ............................................. G06F 12/00
(52) U.S. Cl. ........................................ 711/108; 365/49
(58) Field of Search .............................. 365/49, 189.07; 711/108

(56) References Cited

U.S. PATENT DOCUMENTS

| | | | | | |
|---|---|---|---|---|---|
| 3,984,821 A | * | 10/1976 | Locke | ............. | 365/49 |
| 4,254,476 A | * | 3/1981 | Burrows | ............. | 365/49 |
| 4,296,475 A | * | 10/1981 | Nederlof et al. | ............. | 711/108 |
| 4,366,551 A | * | 12/1982 | Holtz | ............. | 707/1 |
| 4,831,586 A | * | 5/1989 | Nakagawa et al. | ............. | 365/49 |
| 6,252,789 B1 | | 6/2001 | Pereira et al. | | |
| 6,253,280 B1 | * | 6/2001 | Voelkel | ............. | 711/108 |

FOREIGN PATENT DOCUMENTS

CA 2317387 3/2001

* cited by examiner

Primary Examiner—Donald Sparks
Assistant Examiner—Christian P. Chace
(74) Attorney, Agent, or Firm—Kevin Pillay; Ogilvy Renault (57) ABSTRACT

A content addressable memory (CAM) for generating intermediate search results in a search on a stored data word sequence. The CAM comprises a plurality of rows of CAM cells each for storing a data word in the data word sequence; a plurality of match lines each coupled to a corresponding row of CAM cells, each for generating a corresponding match line signal. A priority encoder is coupled to the match line for generating a match address in response to a match line signal; and a plurality of logic circuits, each coupled to corresponding match lines for selectively coupling the match line signal to the priority encoder in response to an instruction signal, the instruction signal for instructing the CAM to generate a match address output on a new search or on a continuation of a previous search, such that portions of the data word sequence occurring at any intermediate location within the sequence provides match results in response to input search data which are equivalent to portions of the stored data word sequence.

10 Claims, 11 Drawing Sheets

|    | D1 | D2 | D3 | D4 | D5 |
|----|----|----|----|----|----|
|    | i  | c  | a  | l  | ■  |
|    | a  | i  | p  | o  | ■  |
|    | s  | l  | /  | r  | ■  |
|    | o  | /  | g  | |  | ■  |
|    | m  | m  | n  | s  | m  |
|    | .  | o  | i  | t  | t  |
|    | w  | c  | c  | n  | h  |
|    | w  | .  | n  | e  | .  |
|    | w  | d  | e  | t  | e  |

Figure 6a

|    | D1 | D2 | D3 |
|----|----|----|----|
|    | i  | c  |    |
|    | a  | i  |    |
|    | s  | l  |    |
|    | o  | /  | g  |
|    | m  | m  | n  |
|    | .  | o  | i  |
|    | w  | c  | s  |
|    | w  | .  | n  |
|    | w  | d  | e  |

Figure 6b

■ = Blank character

☐ = "don't-care" character

|    | W0 | W1 | W2 | W3 | W4 | W5 | W6 |
|----|----|----|----|----|----|----|----|
|    | ■  | ■  | ■  | n  | ■  | p  | m  |
|    | ■  | ■  | ■  | i  | ■  | -  | t  |
|    | ■  | d  | ■  | s  | ■  | s  | h  |
|    | ■  | i  | ■  | n  | ■  | i  | .  |
|    | ■  | a  | ■  | e  | ■  | t  | t  |
|    | ■  | s  | m  | c  | ■  | a  | n  |
|    | w  | o  | o  | i  | ■  | h  | e  |
|    | w  | m  | c  | l  | ■  | w  | t  |
|    | w  | .  | .  | /  | g

CIRCUIT AND METHOD FOR PERFORMING VARIABLE WIDTH SEARCHES IN A CONTENT ADDRESSABLE MEMORY

This application claims the benefit of provisional application No. 60/325,217 filed Sep. 28, 2001.

The present invention relates generally to the field of content addressable memories (CAMs) and more particularly to a circuit and method for searching a CAM with search data having variable word widths.

BACKGROUND OF THE INVENTION

A content addressable memory (CAM) is a memory device in which data is accessed and modified based on the content of the stored data, rather than the location where the data is stored. In general, a typical CAM search operation involves receiving a search data word and comparing the search data word with all entries in the CAM to determine whether there exists a single match, a multiple match or a mismatch between the search data word and entries in the CAM. Each storage location in a row of a CAM is connected to a matchline that indicates a match or mismatch result of the comparison between the stored data word and the search word. All match lines indicating a match condition are typically processed by a priority encoder to determine a highest priority match address which is provided as an output of the CAM.

Each data word and match line combination has a unique N-bit address within the CAM. Accordingly, for any search cycle there may be up to $2^N$ match lines activated. As mentioned, the CAM typically includes a priority encoder for generating the N-bit address corresponding to the highest priority active match line. This N-bit address may be used for network applications such as Internet Protocol (IP) routing table lookup, compression and decompression as well as fully associative cache memory implementations in microprocessor systems.

Ternary CAMs are widely used in networking applications due to their ability to store logic "1", logic "0" as well as "don't care" states. CAMs are commonly available in data widths that are 72-bits and 144-bits and more recently 288-bits wide. Typically in networking applications, the 72-bit storage mode is used to store medium access controller (MAC) addresses for Layer 2 bridging tables, while Layer 3 Internet Protocol (IP) routing tables are stored using the 144-bit mode. Each IP routing table entry consists of a source address, source port, destination addresses, destination port and some kind of QOS (Quality of Service) or TOS (Type of Service) field. In CAMs supporting both data widths, both types of tables can be maintained thereby reducing system cost allowing a common CAM resource to be used for the two functions.

When search data widths are known beforehand such variable width CAMs are useful, however in applications such as URL (Uniform Resource Locator) lookup, search data widths are typically very long and are of undetermined length. The current variable data width CAMs are still limited to discrete predetermined widths and thus the use of CAMs for this purpose has gained little support.

As mentioned above, it would be useful to store URLs in a CAM to accelerate network traffic associated with frequently accessed world wide web pages and deal effectively with web page caching. If a very-wide CAM (hundreds to thousands of bits wide) is implemented that could handle most URL lengths, there would be a large amount of wasted storage space when storing typical or short URLs. In such a circumstance, utilizing the same CAM for bridging or routing entries would become wasteful.

Thus, although variable pre-set word-width CAMs do exist, there is still a need for a CAM that supports arbitrary word width searches and which is capable of switching between one or more types of searching "on-the-fly". Furthermore, different word-width entries should be stored in CAM words having arbitrary boundaries so that the entire CAM can be utilized without unused or wasted gaps between entries.

One example of a system for searching words which are wider than default word widths stored in a CAM is presented in U.S. Pat. No. 6,252,789 to Pereira et al. Pereira describes circuitry that allows a data word chain wider than the width of a CAM row to be stored and searched in one or more rows of the CAM. As a result, wider word searches can be performed with a CAM organized physically into multiple smaller words.

In Pereira, a sequence of one or more data words is stored in one or more rows of CAM cells. Each row has an associated match line and width expansion logic circuit. The width expansion circuits are interconnected and each have a carry input, a canny output and a match line output for determining how to provide match results to the priority encoder and to each other. Control signals generated by an instruction decoder are provided to each width expansion logic circuit for determining when to provide a first, subsequent and last word in the data word chain for comparison with data stored in the CAM. If a search data word having a default word width is provided, the match output signal in each width expansion logic circuit is provided to the priority encoder and the carry output signal is held in an inactive state. If the search data word provided to the CAM is the first word of a multiword chain however, each match line output signal is set to indicate a mismatch, i.e. it is suppressed, and each carry output signal is propagated to the next width expansion circuit. If the search data word provided to the CAM is subsequent word of a multiword chain, each match line output signal indicates a mismatch and each carry output signal is generated by the logical combination of the carry input signal and the intermediate match line result and is similarly propagated to the next width expansion circuit. If the search data word provided to the CAM is the last word of a multiword chain, each match line output signal indicates a match if the logical combination of the carry input signal and the intermediate match line result are both activated. As a result, a match result is not provided to the priority encoder until the last word in a multiword data chain has been compared to the contents of the CAM. This approachtherefore is only effective in exact match multiple word searches. As a result, a disadvantage of this approach is that intermediatesearch results are unavailable. For example in case a closest match occurred before the last word of tee multiword search data was provided, that closest match result would effectively be masked.

Thus, there is still a need for a CAM that is capable of searching variable width data words and wherein storage of data words makes efficient use of the CAM.

SUMMARY OF THE INVENTION

A content addressable memory (CAM) for generating intermediate search results in a search on a stored data word sequence, the CAM comprises a plurality of rows of CAM cells each for storing a data word in the data word sequence; a plurality of match lines each coupled to a corresponding row of CAM cells, each for generating a corresponding match line signal; a priority encoder coupled to the match line for generating a match address in response to a match line signal; and a plurality of logic circuits, each coupled to corresponding match lines for selectively coupling The match line signal to the priority encoder in response to an instruction signal, the instruction signal for instructing the CAM to generate a match address output on a new search or on a continuation of a previous search, such that portions of the data word sequence occurring at any intermediate location within the sequence provides match results in response to input search data which are equivalent to portions of the stored data word sequence.

BRIEF DESCRIPTION OF THE DRAWINGS

The features and advantages of the present invention are illustrated by way of example and are by no means intended to limit the scope of the present invention, the particular embodiments of which are described in the following figures as follows.

DETAILED DESCRIPTION OF THE PREFERRED EMBODIMENTS

In the following description like numerals refer to like structures in the drawings.

Figure 1:
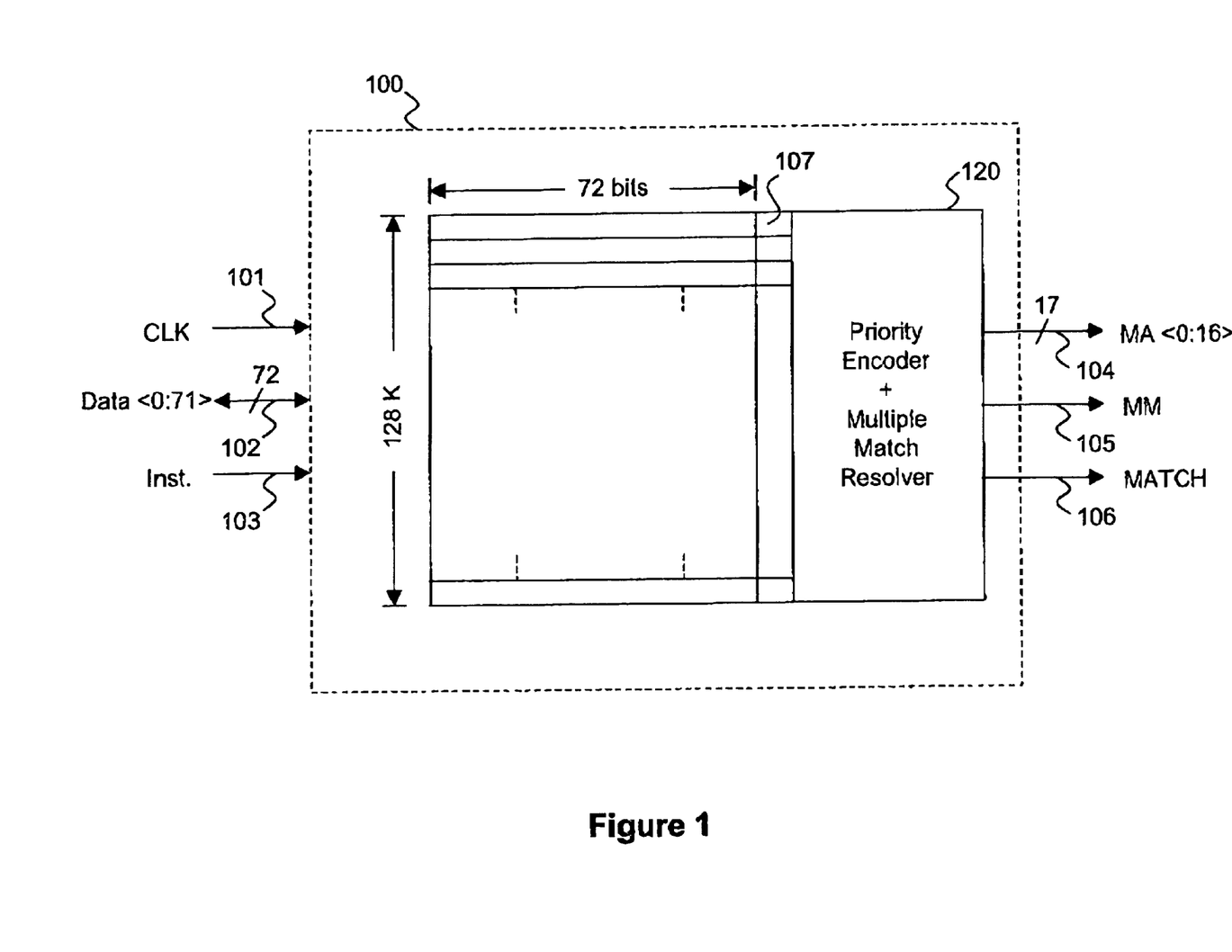
FIG. 1 is a schematic simplified block diagram of a CAM array according to an embodiment of the invention.

Referring to FIG. 1, there is shown a single CAM array 100 according to an embodiment of the invention organized as 128k×72-bit entries. A 72-bit word is accessed on a 72-bit data bus which serves three purposes: providing 72-bits of search data when performing search operations; providing 72-bits of write data to store entries; and reading 72-bits to download entries already stored in the table. The data bus is bi-directional so that it can accommodate these three functions. The CAM includes a priority encoder and multiple match resolver (MMR) 120, the operation and construction of which are described in pending U.S. patent application Ser. No. 09/954,074, incorporated herein by reference although other conventional priority encoding circuits could be employed without impacting the embodiment of the present invention. Essentially, the priority encoder and multiple match resolver 102 receive as inputs all match line latch outputs and generate a highest priorty match address.

During searches, the match line latch 107 associated with each match line carries the search result, i.e. a "hit" (match) or a "miss" (no-match), of a comparison between the stored data and search data provided for each entry. The priority encoder and MMR (Multiple Match Resolver) 120 convert the 128k "hit" or "miss" indications into a single highest priority address representing the most significant "hit". Storage locations are organized from highest to lowest priority. In addition, a MATCH bit indicating whether a match has occurred in the array is provided as an output. Furthermore a multiple match MM flag output is also provided as an output, indicative of whether a multiple match has occurred. If there is no "hit" (or match) the MATCH bit remains logic "low". If there is at least one hit, the MATCH bit will be set to logic "high". If more than one hit occurs in any given search, the MATCH bit will be set to logic "high" and the multiple match MM flag will also be set to logic "high".

Figure 2:
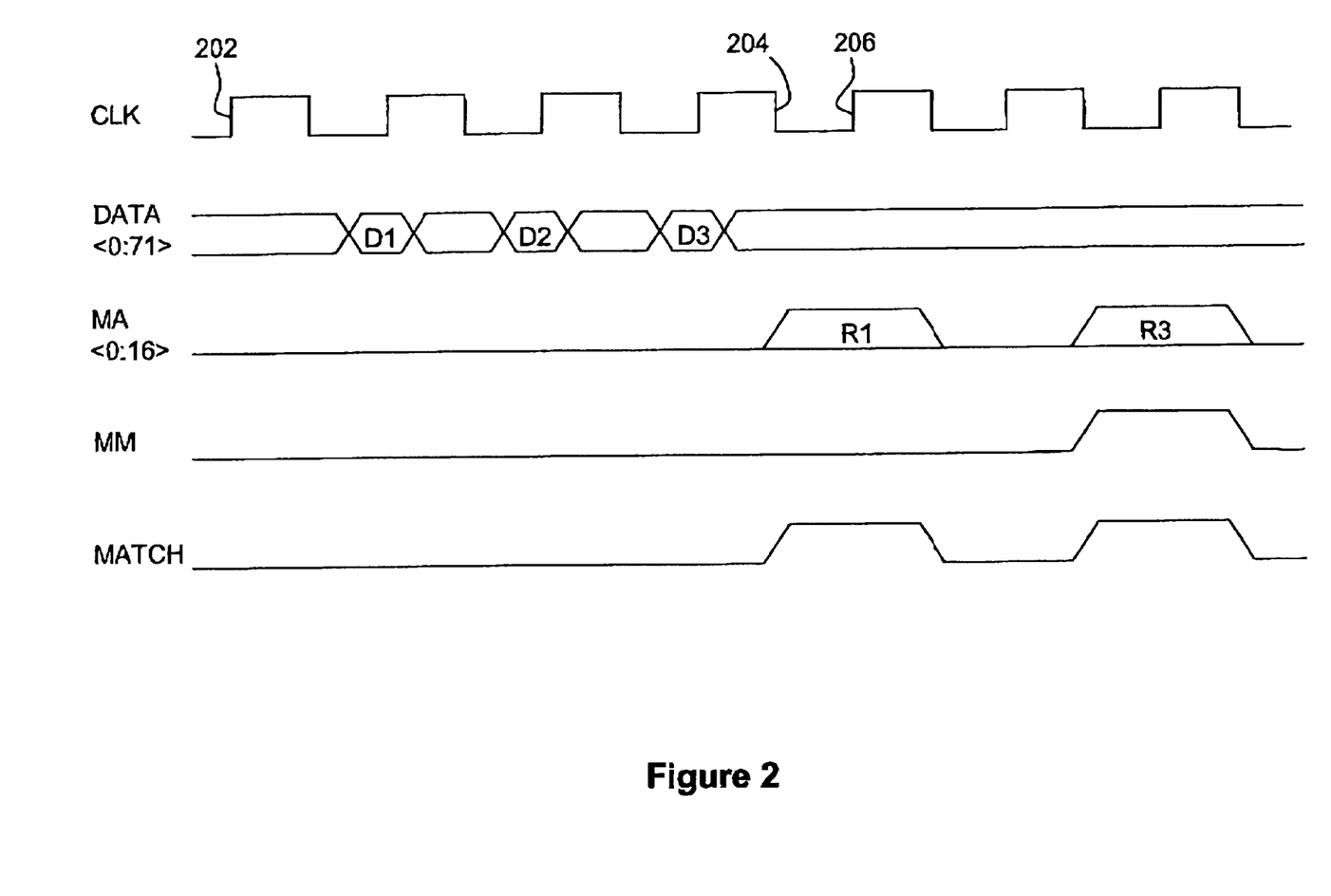
FIG. 2 is a timing diagram showing the search timing for the CAM array of FIG. 1.

Referring to FIG. 2, a series of three typical search operations performed on the CAM array 100 is illustrated. On a first rising edge 202 of the system clock signal CLK, search data S1 is clocked into the CAM. Roughly two and a half (2½) clock cycles later 204 the result of the search match address (MA), R1 is available. A single match is indicated by MATCH=1 and MM=0, at the CAM array outputs. The result is available to be latched by external circuitry (not shown) on the third clock edge 206, hence this is referred to as latency 3 operation, i.e. a delay of 3 system clock cycles between issuance of search instruction and the availability of search result. These several clock cycles are required internally by the CAM to latch in search data, format it for the search, precharge match lines, generate match results for each entry, encode the most significant match and drive the output pins.

Searches may be performed on every clock edge by implementing an internally pipelined architecture Search S2 results in a "miss" so no match address is output. Search S3 results in a multiple match (setting MM=high) so that only the most significant match address R3 appears on the MA bus output.

Figure 3:
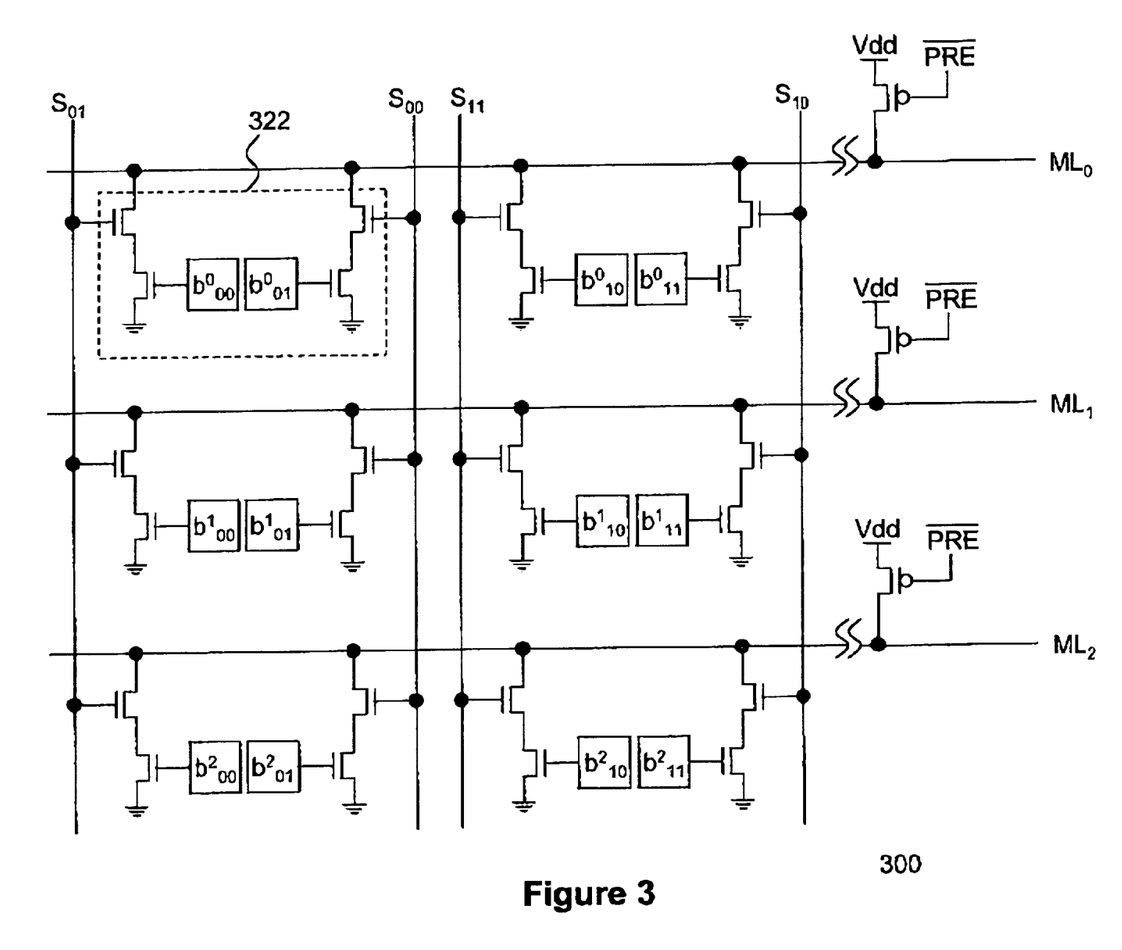
FIG. 3 is a block diagram showing part of a CAM array of FIG. 1.

Referring to FIG. 3, there is shown a small subset of an array 320 of cells of a ternary CAM 300. Each ternary cell 322 contains two storage elements for storing two bits, indicated as $b_{k0}$ and $b_{k1}$ as well as comparison transistors for comparing stored data with search data. The storage elements can be of any type of Static Random Access Memory (SRAM) or Dynamic Random Access Memory (DRAM) cells, both of which are well known in the art. Ternary data is stored as shown in table I below. Each row of cells in the array forms a data word with each cell in the row coupled to match line ML. The match lines $ML_o$–$ML_n$ are each coupled via respective precharge transistors to $V_{dd}$. The transistors are controlled by an active logic "low" precharge signal PRE\. The columns of cells in the array are coupled to respective search lines $S0_1$; $S0_0$; $S1_1$, $S1_0$; $SN_1$; $SN_0$.

TABLE I

| Data | $b_{k0}$ | $b_{k1}$ |
|---|---|---|
| Logic "0" | 0 | 1 |
| Logic "1" | 1 | 0 |
| "Don't care" | 0 | 0 |

Search data applied to each column follows the same format.

Figure 4:
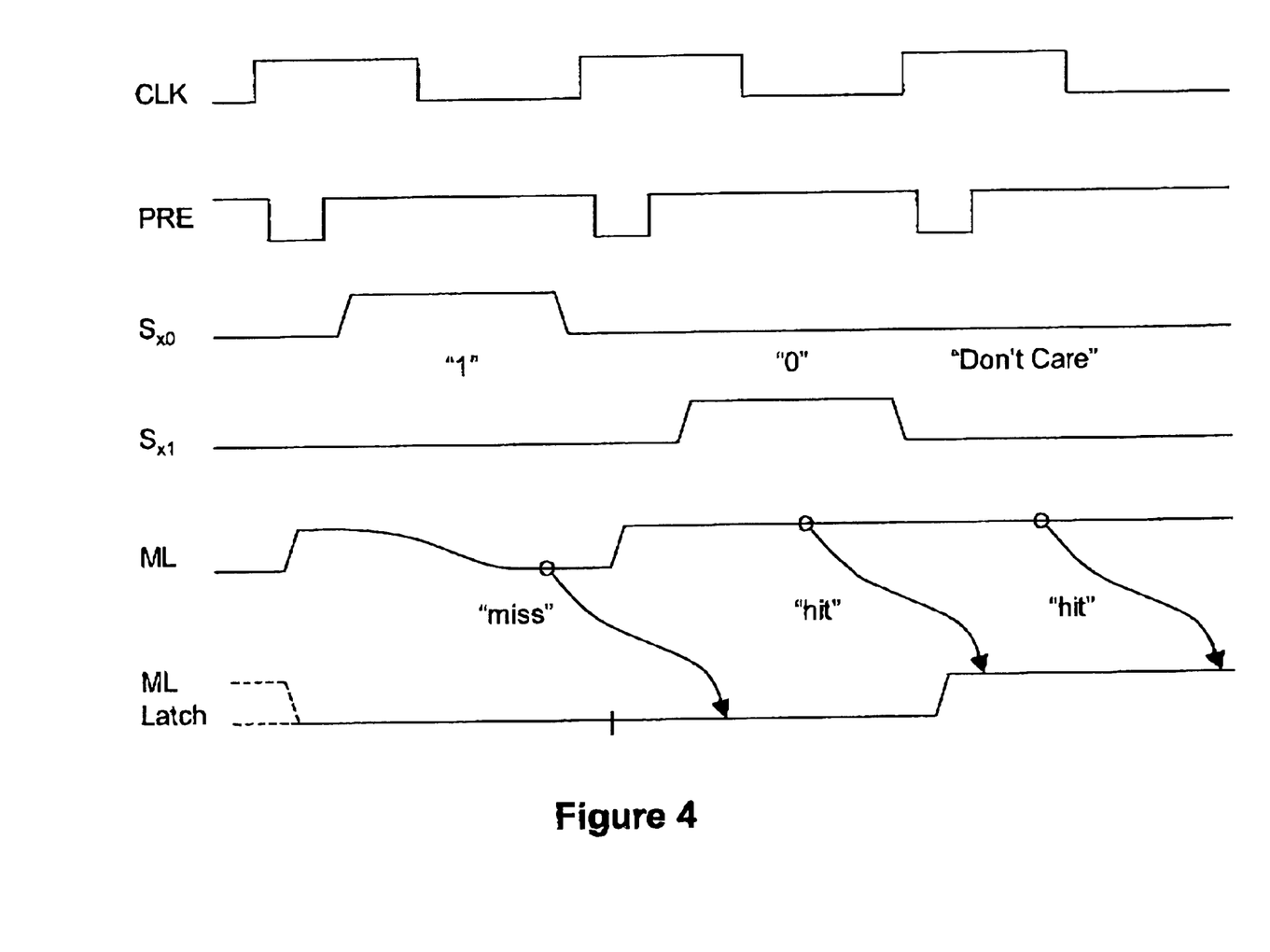
FIG. 4 is a timing diagram showing the match line timing for the CAM array of FIG. 3.

Referring to FIG. 4, there is shown a timing diagram of the control and data signals during a search operation for the CAM array of FIG. 3. At the beginning of each clock cycle, the PRE\ signal is pulsed to logic "low" to charge each match line ML up to a positive supply level $V_{dd}$. Then the search data is enabled on the search lines, for example, in FIG. 4, three sequential searches are shown, the first being $S_{x0}=1$, and $S_{x1}=0$ corresponding to searching with a logic "1", the second being $S_{x0}=0$, and $S_{x1}=1$ corresponding to searching with a logic "0", and the third being $S_{x0}=0$ and $S_{x1}=0$, corresponding to searching with a "don't care" state or effectively masking that CAM cell. Therefore, in general for this preferred embodiment, any CAM cell storing a "don't care" state will be unable to discharge the match line from its precharged "high" to Vdd state. Any CAM cells in columns in which search data is a "don't-care" (i.e. $S_{x0}=0$, $S_{x1}=0$) will also be unable to pull down the match line. If data stored in the cell matches search data, the particular cell will not pull down the match line either. Only in the case of a CAM cell not having "don't care" data stored in the cell or on the search lines, and a cell where the stored data is complementary to the search data (i.e. $b_{k0}=S_{k1}$ and $b_{k0}=S_{k0}$) will the match line be discharged to indicate a "miss". A "miss" on any cell coupled to its corresponding match line will result in a "miss" for the entire row. In other words, the match lines are precharged to a "hit" condition and discharged by a "miss" condition on any associated cell.

As discussed with reference to FIG. 1, the "hit/miss" indications latched in individual match line latches are provided to the priority encoder/multiple match resolver circuit block, which provides a single encoded address of the highest priority hit. The entries in the CAM are organized in sequence from lowest priority to highest priority.

The general operation of a CAM array according to an embodiment of the invention has so far been provided as background for framing the specific problem solved by the present invention. The specific problem solved by the present invention, as described briefly in the Background of the Invention section, relates to how to process match line results of a variable word width search. More specifically, it is desirable to quickly and flexibly provide search results for search words having widths greater than a default word width stored in the CAM array. As previously described, the conventional approach described in Pereira provides a "match" result only in case of an exact match between the bits of the search data and those of the bits stored in respective rows of the CAM and will provide such a match result only after the entire search string is searched. As a result, although a wide word (such as an URL) may have been stored in the CAM, it cannot be used to identify a "match" in the case when a search is to be performed on only part of the word. Other circuits to date have also not been able to achieve this objective.

Figure 5:
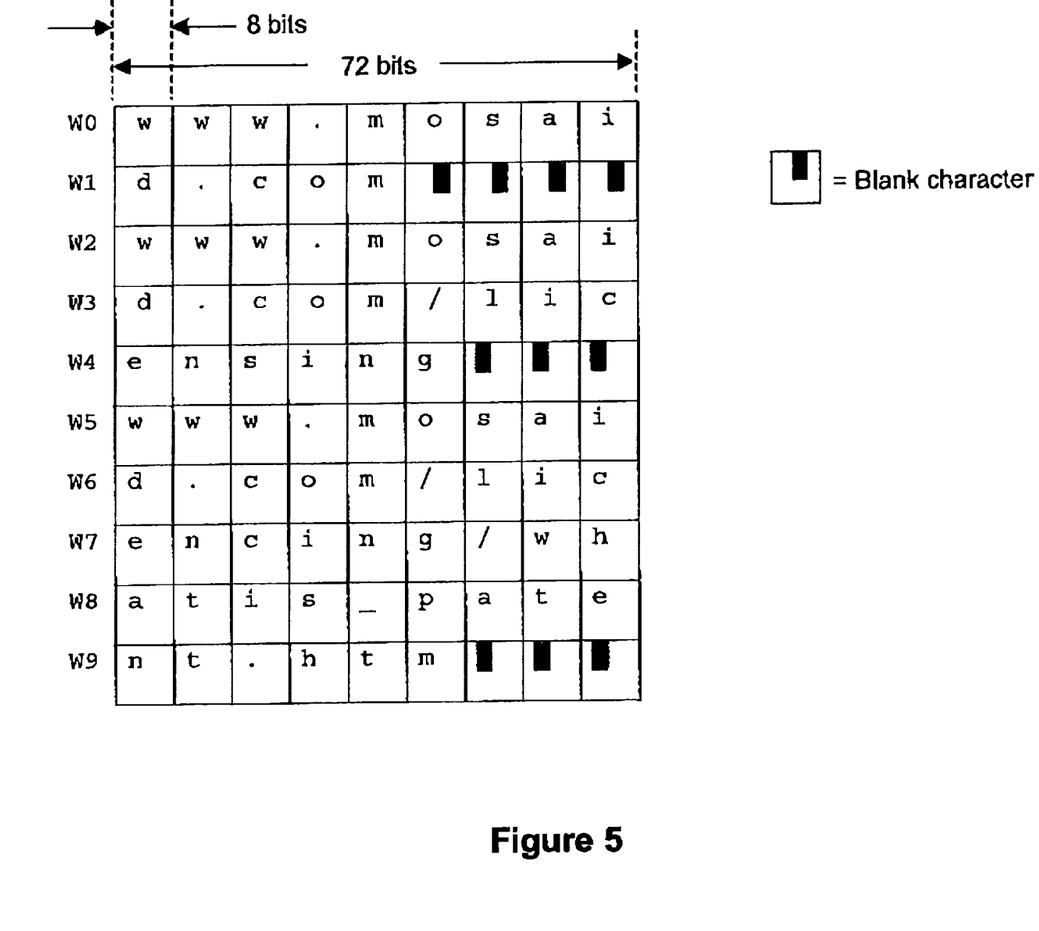
FIG. 5 is a diagram showing exemplary data stored at a number of sequential address locations in the CAM array of FIG. 1.

This problem is further illustrated by referring to an example. Accordingly, referring to FIG. 5, there is shown an array of characters representing, symbolically, a sample of the contents of a number of rows of a CAM array which is used to store URL's of various lengths. Each element on the symbolic array represents a character of the URL requiring 8-bits of the CAM. Blank characters are used for locations as indicated in the figure, thereby allowing exact matches to occur. The organization depicted in FIG. 5 is thus comparable to a 72-bit wide CAM array. As may be seen from the example, the various entries in the CAM array may correspond to successive web pages accessed by a user. If the user had previously accessed a URL at "www.mosaid.com/licensing", which is stored in the CAM, the next time the user wanted to simply access the page "www.mosaid.com", a match address would not be generated in the CAM unless that exact URL was already stored in the CAM. As a result of this exact match requirement, each URL possibly needing to be accessed by a user at the same web site must be entered into the CAM to ensure an exact match. This is wasteful in terns of CAM space. In other words, supposing that instead of the address "www.mosaid.com", the address stored in rows 0 and 1 corresponds to "www.mosaid.com/ip" and the user wanted to access "www.mosaid.com". The prior art approach proposed in patent '789 would not output a match address even though multiple matches occur for a portion of the 72-bit word corresponding to "www.mosai" at address row 0, 2 and 5.

The present invention thus provides one solution to this problem. According to an embodiment of the invention, a search data swing having a word width which is wider than a default word width stored in a CAM is segmented into a group of words having the default width are searched in succession within the CAM. Intermediate search results are provided to the priority encoder and multiple match resolver upon completion of each of the searches. Once the last word within the group of words has been searched, the user can determine based on the intermediate search results which was the best match and proceed with further more limited searches if required.

Figure 6A:
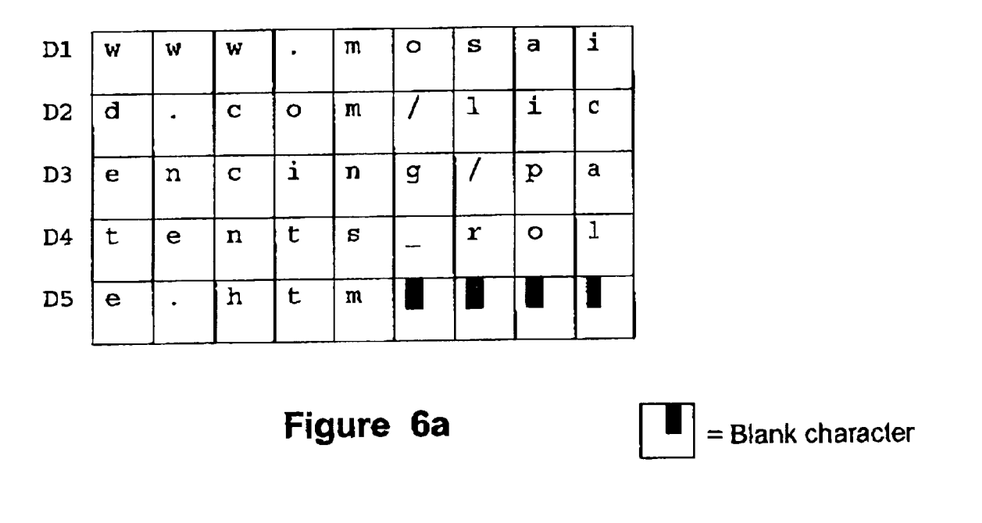
FIGS. 6(a) and 6(b) are schematic diagrams of search data sequences applied to a CAM.
Figure 7A:
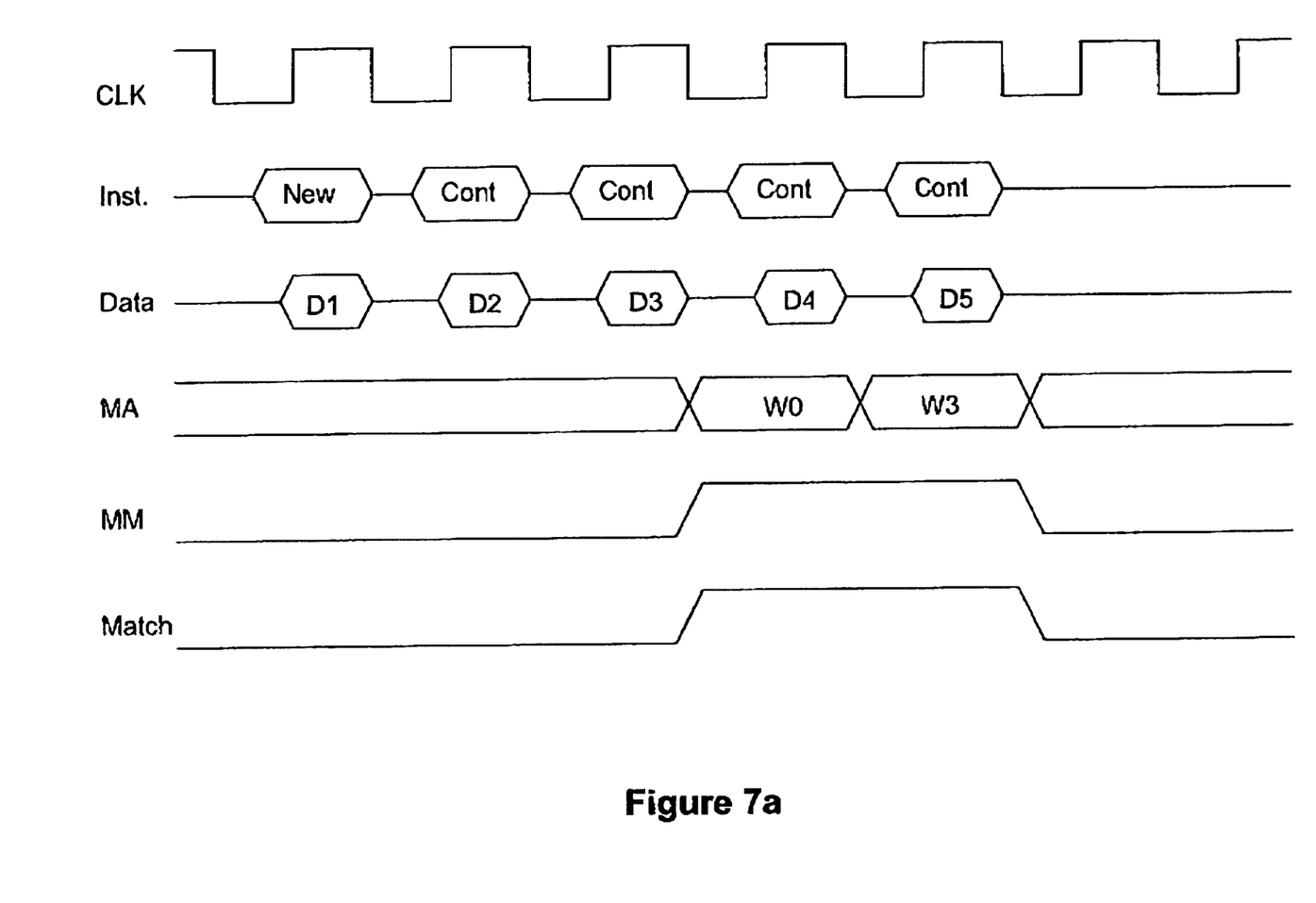
FIGS. 7(a) and 7(b) are timing diagrams for search operations using search data in FIGS. 6(a) and 6(b) respecitvely.

The advantage of the modified CAM may be illustrated by referring to a sample search data input shown in FIG. 6(a) which is applied to the contents (shown in FIG. 5) of the CAM. For data work D5, blank characters or "don't-care"characters can be stored depending on how the CAM is to be searched i.e. if an exact match is desired or a partial match is desired. These characters would be written by the CAM cardholder (USER) when the contents of the CAM are initialized. FIG. 7(a) illustrates the search timing from a user's point of view corresponding to searching the data in FIG. 6(a) in accordance with the present invention to provide intermediate search results during search operations. An instruction decoder within the CAM (not shown) receives each successive search instruction and generates an instruction bit corresponding to each search word indicating whether the 72-bit search word represents a new search operation or a continued search operation With reference to FIGS. 6(a) and 7(a), assume that the search input is the URL "www.mosaid.com/licensing/patents_role.htm" which the user wants to access. This URL is split into the five 72-bit search words D1–D5 shown in FIG. 6(a). Each 72-bit search word D1–D5 of the search input is applied to the CAM along with a corresponding instruction word (INST) on the rising edge of the clock signal. A bit (CONT/NEW) within the instruction word indicates whether its corresponding search word is a new search word or a search word of a continued search. The first 72-bit search word D1, comprising the partial URL "www.mosai", results in a multiple match at addresses 0, 2 and 5 based on the contents of the CAM array shown in FIG. 5. The CAM circuitry thus asserts the MATCH bit and a multiple match flag (MM) to logic "high" and outputs the highest priority match address MA=0. On the following 72-bit search word D2, corresponding to the partial URL "d.com/lic", matches are indicated at address 3 and 6 and the highest priority match address is output MA=3. After the third search is performed and D3 (comprising partial URL "ensing/pa") is provided, there are no further matches. As a result, since two multiple match results and no other match results occurred, the user would most likely continue with a more precise search based on the intermediate multiple match results provided. It should be noted that intermediate multiple match results MA=0, MA=3 were provided before the search of the entire URL was searched unlike the prior art approach which suppresses these intermediate search results.

Figure 6B:
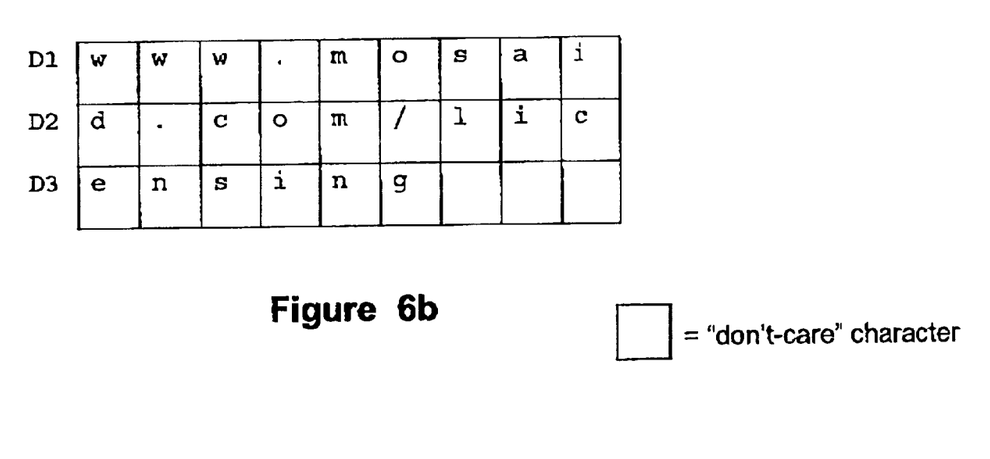
Figure 7B:
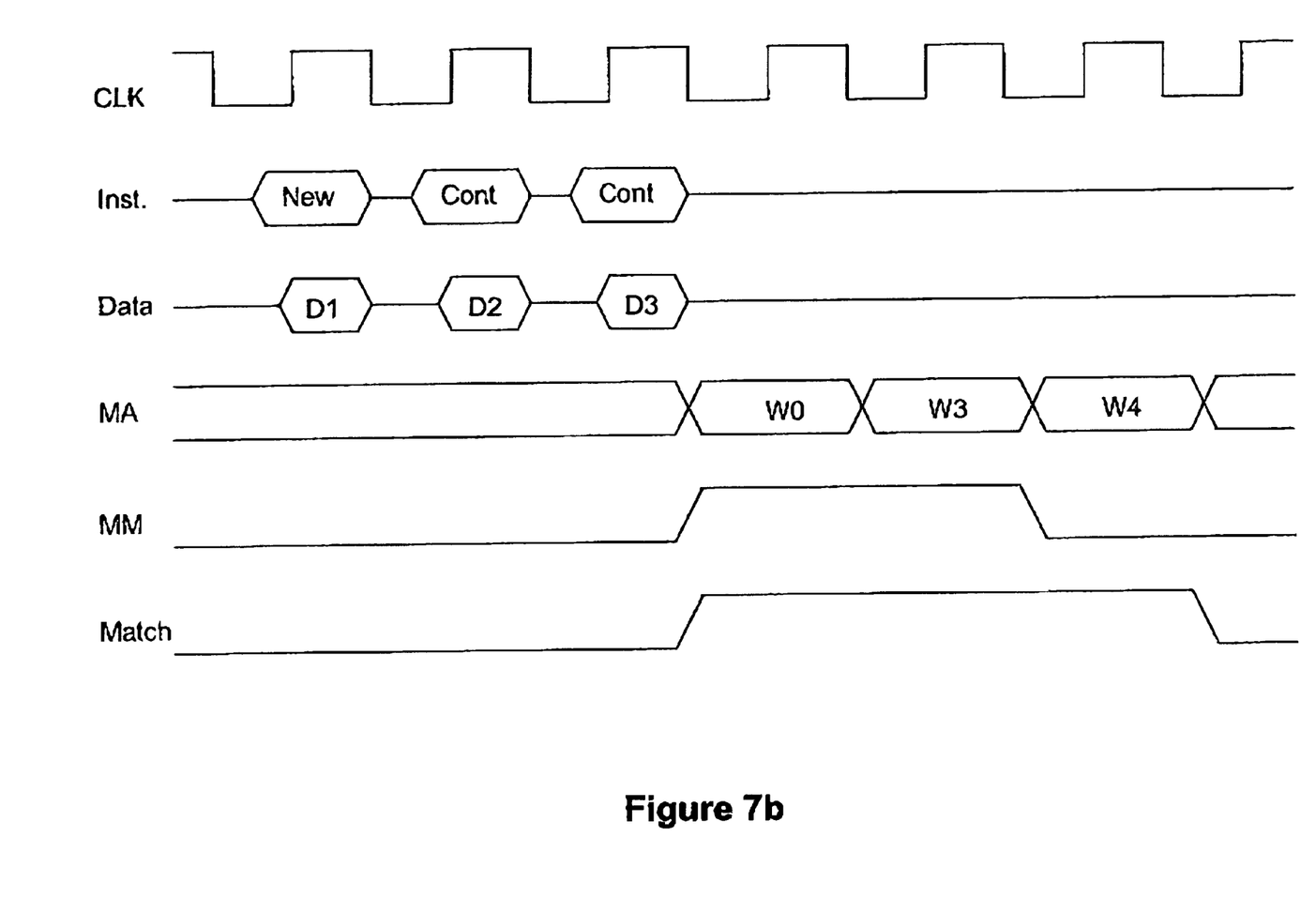

From the intermediate match address outputs, the user can determine that there were matches for a portion of the search input, for the first two consecutive search words. The user may find that this partial match indicates that there may be a URL address stored in the CAM which contains sufficient information to continue the search, essentially looking for an exact match to a more precise search data word. Based on this information, a second search sequence "www.mosaid.com/licensing" as shown in FIG. 6(b) could be provided to the CAM. If the prior art approach were used in this case, since no direct match exists, the result of the search would be a "miss". In the case of the present invention however, the result of the second search sequence illustrated in FIG. 6(b) will be a multiple match with output of highest priority match address MA=0, multiple match with highest priority match address MA=3, and finally a single match MA=4. The latter is the best match URL. In this case the unused trailing characters in the search data are set to "don't-care." Even though an exact match has been found, the CAM will not mask or suppress the partial matches found as was the case with the prior art approach, so the user (rather than the CAM on its own) can choose to ignore the previous addresses (MA=0 and MA=3) if they are not useful. The timing diagram for this search is shown in FIG. 7(b).

Figure 8:
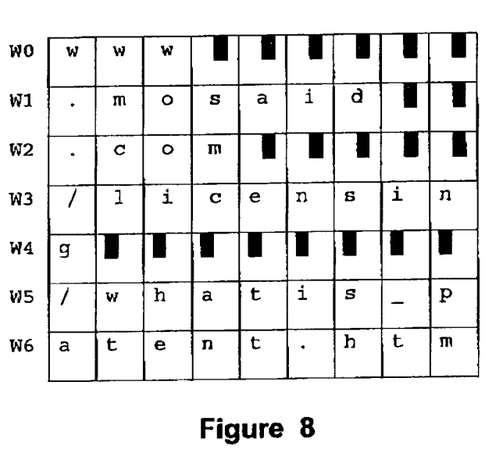
FIG. 8 is a diagram showing data stored in the CAM in accordance with an another embodiment of the present invention.

Alternatively, instead of storing a URL in the CAM as shown in FIG. 5, the URL can be parsed or segmented such that each segment is stored beginning at a new CAM word location, i.e. no segment crosses a CAM word boundary. An example showing the storage of the URL "www.mosaid.com/licensing/whatis_patent.htm" in a storage arrangement according to another embodiment of the invention is shown in FIG. 8. As may be seen, this arrangement saves three storage locations compared to that shown in FIG. 5. In general, using this type of parsed data storage is beneficial if URLs being stored are closely related. If the URLs to be stored in the CAM are not related, then such an approach would require more CAM space than the approach described with reference to FIG. 5. Also, this approach gives the best match in a single search sequence without having to submit another set of input to resolve a MM situation as in the previous example. This approach also gives the flexibility of searching for the exact stored URL, by inserting blank characters, or allowing a fragment to result in a hit by inserting "don't-cares" in the input string.

Figure 9:
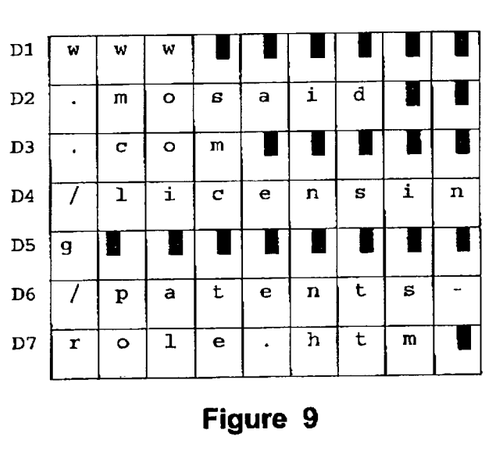
FIG. 9 is a diagram of a search sequence to be applied to the CAM data shown in FIG. 8.
Figure 10:
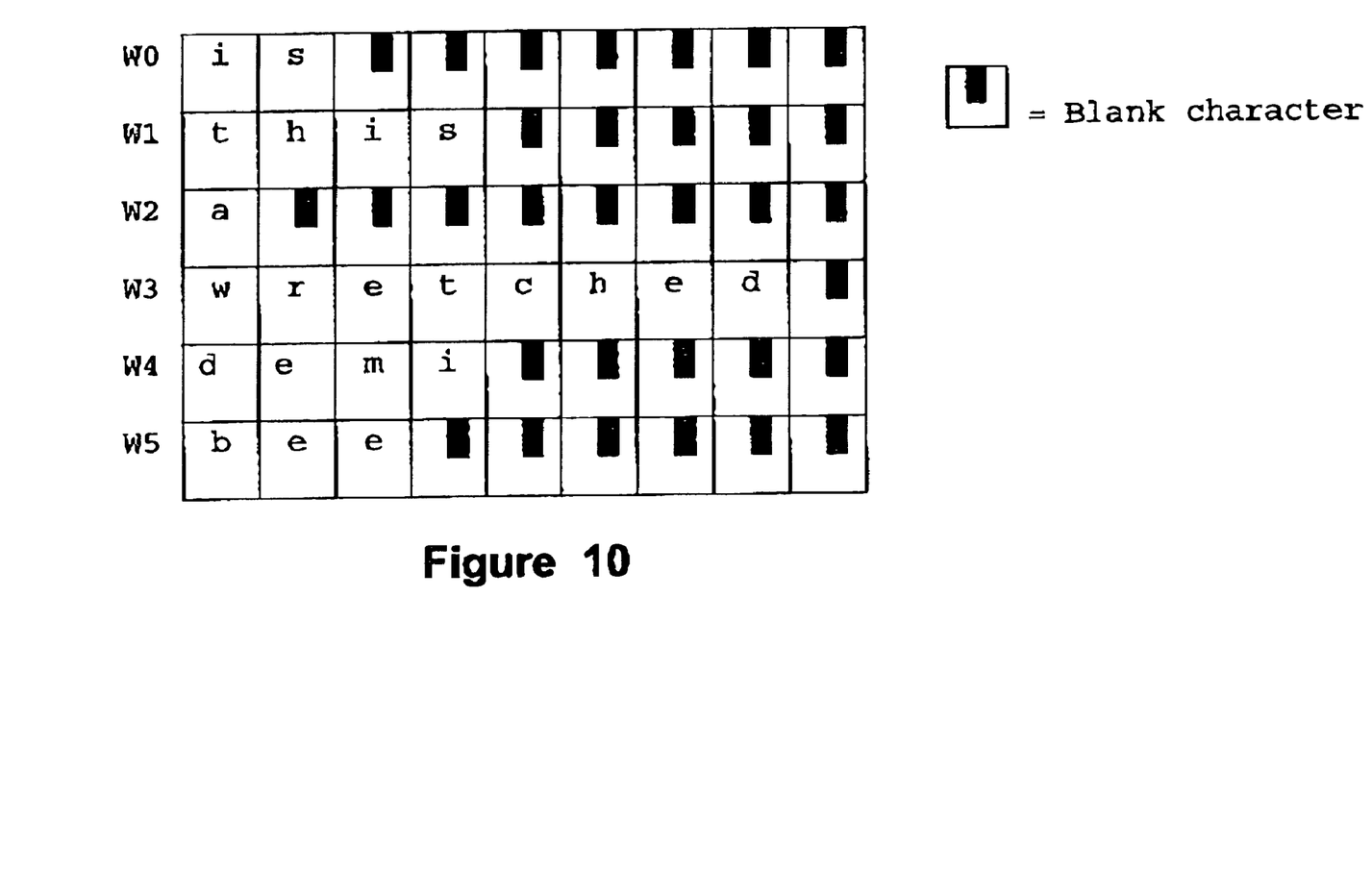
FIG. 10 is a diagram showing data stored in the CAM cell according to yet another embodiment of the invention.

Performing a search on the data stored as shown in FIG. 9 with the input search data sequence "www.mosaid.com/licensing/patents-role.htm" as shown in FIG. 10 will result in matches MA=0, 1, 2, 3 and 4, followed by misses. Even though the input sequence is longer than in the previous approach, the result is obtained in a single pass, thereby avoiding the need for a second search as was discussed with reference to FIGS. 6(b) and 7(b).

As may be seen from the example shown in FIG. 9, the storage requirements are smaller for the parsed data structure because the prefix's do not have to be repeated, although this may vary on a case to case basis depending on the number of URLs share a common prefix. A further variant is to employ the compressed data structure but search with trailing "don't care" characters. In this case the entries 0 to 4 would be unnecessary.

Figure 11:
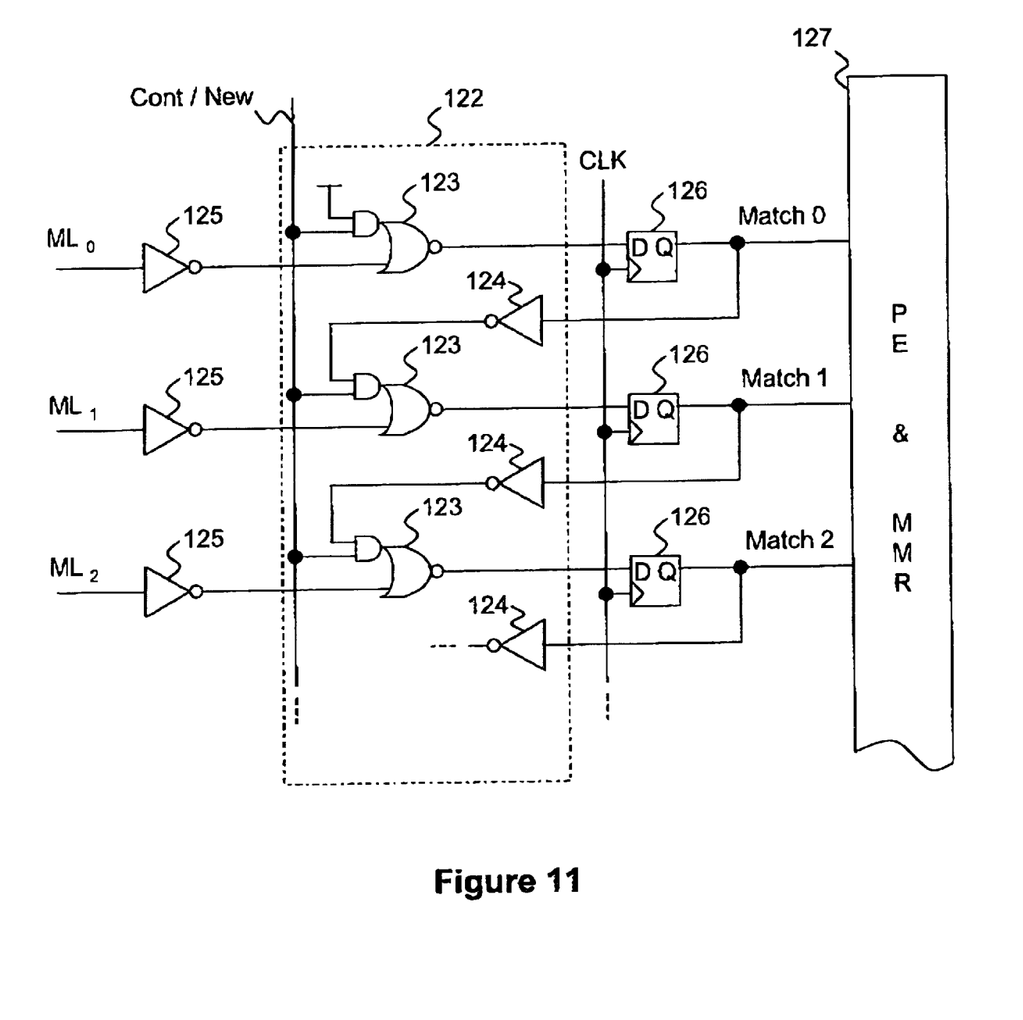
FIG. 11 is a schematic diagram showing a circuit for processing match line outputs according to an embodiment of the invention.

Referring to FIG. 11, a circuit for processing match line signals to support variable word width searching according to an embodiment of the invention is shown. The CONT/NEW signal can be decoded from the instruction or it may be a separate bit within the instruction word. By latching the result of the combined search, rather than just the individual match result, word searching can be interrupted for background operation. For example, read or write operations for table maintenance could be inserted between any of the search operations shown in FIG. 6 and the multi-word search functionality would not be affected. In FIG. 12, the match line signals ML0, ML1, ML2, ... are amplified by inverters 125 and then input into a logic circuit 122. Logic circuit 122 comprises, for each corresponding match line output, an AND-NOR gate 123 and an inverter 124. Each AND-NOR gate 123 receives at one respective input the match line outputs driven by the inverters 125 and as another input, a combination of the CONT/NEW logic signal and the result of a latched match condition on a lower priority match line which is provided via inverters 124. The outputs of AND-NOR gates 123 are provided as inputs to match line D-type flip/flops 126, the Q outputs of which are provided to the priority encoder and multiple match resolver 127.

The operation of the logic circuit 122 may be explained as follows. At the beginning of a new multi-word search, the first data word is applied to the CAM array to generate individual match indications on the match lines. At the same time the appropriate bit is provided from the instruction decoder to produce the internal CONT/NEW control signal which is set to logic "0", indicating a new multi-word search is beginning. As a result, the "D" type flip-flops will latch the result of individual match lines without regard to the status of adjacent match lineflip/flops. On subsequent words of multi-word searches, the internal CONT/NEW control signal is set to logic "1" by appropriate decoding of the instruction word. Once CONT/NEW has been set to logic "1" indicating a subsequent word of a multi-word search is being searched, in order for any D-type flip/flop to record a match, both its associated match line as well as the previous match line location in the CAM array will have to have registered a match in the previous cycle. As can be seen in FIG. 12 each D-type flip/flop receives the output its associated AND-NOR gate 123 which combines the results of the associated match line as well as with the results of a lower priority match line provided from a previous D-type flip/flop via inverter 124. In this way, a cumulative match match result from each match line from lowest to highest priority is propagated from location to location during a multiple word search, generating intermediate match results for use by a conventional priority encoder and multiple match resolver circuit.

Although URL's are used as an example, virtually any kind of search could be performed. For example sentences and phrases could be stored in the same manner. As shown in FIG. 11, the sentence "is this a wretched demi bee" can be stored in a parsed mode within 6 words of 72 bits. In this case assume that the user wants to search for a phrase that does not necessarily start at the beginning with of the entry, such as "demi bee". The prior art approach will fail to provide a hint of where the information is located, because it will look for an exact match. As a result, a partial result will be discarded, thus losing the advantage of knowing that there is a match of the searched data in the CAM. With the present invention however, the capability of providing partial match results will indicate to the user that the data searched is contained within the CAM at a certain address, in this case at words 4 and 5. With this result, the user can decide if the data found is relevant to the desired search.

In all of these examples the benefits of obtaining a partial match results before the entire input data string is entered are clearly evident. A partial matched URL gives the router a good indication as to where a web page may be located. This is much more efficient than repeatedly searching successively truncated versions of the URL until a match occurs.

While the invention has been described in connection with a specific embodiment thereof and in a specific use, various modifications hereof will occur to those skilled in the art without departing from the spirit of the invention.

The terms and expressions which have been employed in the specification are used as terms of description and not of limitations, there is no intention in the use of such terms and expressions to exclude any equivalents of the features shown and described or portions thereof, but it is recognized that various modifications are possible within the scope of the invention.

The embodiments of the invention in which an exclusive property or privilege is claimed, are defined as follows:

1. A content addressable memory (CAM) for generating intermediate search results in a search on a stored data word sequence, the CAM comprising:

(a) a plurality of rows of CAM cells each for storing a data word in said data ward sequence;

(b) a plurality of match lines each coupled to a corresponding row of CAM cells, each match line having a predetermined priority and for generating a corresponding match line signal;

(c) a priority encoder coupled to said match lines for generating a match address in response to a match line signal; and (d) a plurality of logic circuits, each coupled between corresponding match lines and said priority encoder for selectively coupling its corresponding match line signal or a match line signal from a lower priority match line to said priority encoder in response to an instruction signal, said instruction signal for instructing the CAM to generate a match address output on a new search or on a continuation of a previous search, such that portions of the data word sequence occurring at any intermediate location within the data word sequence provides match results in response to input search data which are equivalent to portions of the stored data word sequence.

2. A CAM as defined in claim 1, including a match latch coupled to each match lines for latching its corresponding match line signal, in response to a clock signal.

3. A CAM as defined in claim 2, for each match line said logic circuit logically combining its match line signal from a previous match. line to output a signal to said match latch, such that in a continued search the match latch latches a match only if the current search word matches and the previous match latch latched a match in the previous search.

4. A method for operating a content addressable memory (CAM) having a CAM array comprising a plurality of CAM rows of a first width, each CAM row comprising a plurality of storage cells and at least a match line, the method comprising the steps of:

(a) providing a data word of a second width;

(b) dividing the data word into a plurality of data word portions of the first width for storing into the plurality of CAM rows;

(c) providing a search word of a width wider than the first width;

(d) dividing the search word in a plurality of partial search words of the first width;

(e) comparing in a first search cycle a partial search word with the data word portions stored in the CAM array and issuing a match signal through the match line to a priority encoder indicating a first address if the search and data words are the same; and (f) comparing in a subsequent search cycle a subsequent partial search word with the data word portions stored in the CAM array and issuing a match signal through the match line to the priority encoder indicating a subsequent address if the search and data words are the same and the result of the previous row in the first search cycle was a match.

5. A method according to claim 4, wherein the first width represent 72 bits.

6. A method according to claim 4, including providing an instruction signal indicating if the subsequent search is a continuation search.

7. A method according to claim 4, including storing "don't care" data to the empty CAM cells of the row where the last portion of the data word is stored, if the last portion of the data word is narrower than the first width.

8. A method according to claim 4, said priority encoder providing the address of the most subsequent search word and data word portions match as the highest priority match.

9. A method according to claim 4, including latching the result of the first search cycle in a latch and combining the latched result with the result of the subsequent search in the subsequent search cycle.

10. A method for operating a content addressable memory (CAM) having a CAM may comprising a plurality of CAM rows of a first width, each CAM row comprising a plurality of storage cells and at least a match line, the method comprising the steps of:

(a) providing a data word of a second width;

(b) dividing the data word into a plurality of data word portions of the first width for storing into the plurality of CAM rows;

(c) providing a search word of a width wider than the first width;

(d) dividing the search word in a plurality of partial search words of the first width;

(e) comparing in a first search cycle a partial search word with the data word portions stored in the CAM array and issuing a match signal through the match line to a priority encoder indicating a first address if the search and data words are the same; and (f) comparing in a subsequent search cycle a subsequent partial search word with the data word portions stored in the CAM array and issuing a match signal through the match line to the priority encoder indicating a subsequent address if the search and data words are the same and an instruction signal indicates that the subsequent search is a new search.

* * * * *